United States Patent
Petricek et al.

(10) Patent No.: US 11,432,439 B2
(45) Date of Patent: Aug. 30, 2022

(54) ELECTRICAL DEVICE AND METHOD FOR ASSEMBLING THE ELECTRICAL DEVICE

(71) Applicant: Siemens Aktiengesellschaft, Munich (DE)

(72) Inventors: Martin Petricek, Hollabrunn (AT); Günter Draschkowitz, Vienna (AT); Andreas Emberger, Vienna (AT)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/279,923

(22) PCT Filed: Sep. 12, 2019

(86) PCT No.: PCT/EP2019/074341
§ 371 (c)(1),
(2) Date: Mar. 25, 2021

(87) PCT Pub. No.: WO2020/064350
PCT Pub. Date: Apr. 2, 2020

(65) Prior Publication Data
US 2021/0400836 A1    Dec. 23, 2021

(30) Foreign Application Priority Data
Sep. 26, 2018 (EP) .................................... 18196877

(51) Int. Cl.
*H05K 7/20* (2006.01)
*H01L 23/40* (2006.01)
*H01L 23/00* (2006.01)
*H05K 1/02* (2006.01)

(52) U.S. Cl.
CPC ........... *H05K 7/209* (2013.01); *H05K 7/2049* (2013.01); *H05K 7/20454* (2013.01); *H01L 23/4006* (2013.01); *H01L 24/90* (2013.01); *H05K 1/0203* (2013.01)

(58) Field of Classification Search
CPC .............. H05K 7/2039; H05K 7/2049; H05K 7/20509; H05K 7/2089–209; H01L 23/4006
See application file for complete search history.

(56) References Cited

U.S. PATENT DOCUMENTS

| | | | |
|---|---|---|---|
| 4,922,601 A * | 5/1990 | Mikolajczak | H01L 23/4093 361/710 |
| 6,347,038 B1 * | 2/2002 | Duarte | H05K 3/0061 361/705 |
| 10,939,585 B2 * | 3/2021 | Chida | H01L 23/4006 |

FOREIGN PATENT DOCUMENTS

| | | |
|---|---|---|
| DE | 60029527 | 3/2007 |
| EP | 0654176 | 5/1995 |
| EP | 3208843 | 8/2017 |

OTHER PUBLICATIONS

PCT International Search Report dated Nov. 29, 2019 based on PCT/EP2019/074341 filed Sep. 12, 2019.

* cited by examiner

*Primary Examiner* — Zachary Pape
(74) *Attorney, Agent, or Firm* — Cozen O'Connor

(57) ABSTRACT

A device and method for assembling an electrical device that includes components attached to a carrier plate and is produced in accordance with an assembly method, wherein at least one component produces dissipated power which is dissipated via a thermal connection to a heat sink.

20 Claims, 3 Drawing Sheets

ELECTRICAL DEVICE AND METHOD FOR ASSEMBLING THE ELECTRICAL DEVICE

CROSS-REFERENCE TO RELATED APPLICATIONS

This is a U.S. national stage of application No. PCT/EP2019/074341 filed Sep. 12, 2019. Priority is claimed on European Application No. 18196877.7 filed Sep. 26, 2018, the content of which is incorporated herein by reference in its entirety.

BACKGROUND OF THE INVENTION

1. Field of the Invention

The present invention generally relates to the field of electrical and electronic devices, particularly the field of switched-mode power supplies and power electronic circuits and, more particularly, to an electrical device, in particular a switched-mode power supply, and a method for assembling an electrical device, in particular the switched-mode power supply and/or a power electronic circuit, which is constructed from components and/or groups of components arranged on a carrier plate, where at least one component produces a power loss (for example in the form of heat) which is dissipated via a thermal connection to a heat sink.

2. Description of the Related Art

Devices, in particular electrical or electronic devices, for example, switched-mode power supplies, power electronic circuits, or control devices, are nowadays usually constructed from electrical components and/or groups of components. Here, the components are fitted to a carrier plate (i.e., a printed circuit board) that is used to mechanically fasten and, via "conductor tracks", electrically connect the components. The components can be fastened to the printed circuit board, for example, via soldering-to-soldering pads or in soldering lands, via adhesive bonding, and by means of screwing in the case of larger components.

Circuits for electrical and/or electronic devices often comprise semiconductor components (for example, power semiconductor elements) that produce a usually thermal energy loss, i.e., heat. In order to prevent damage to or overheating of the respective component or of the circuit and to prevent a malfunction of the device as a result of the power loss or heat that is produced, it is necessary to dissipate the power loss or heat via a thermal connection. That is, the components that produce a power loss or heat must be cooled accordingly and the heat produced must be dissipated.

Heat-dissipating parts, i.e., heat sinks, are usually used to dissipate the heat and to cool a component. The heat sink, which is usually composed of a metal with good thermal conductivity, usually aluminum or copper, forms a "heat bridge" in order to guide the resulting heat away from the component to be cooled and to discharge it to a device environment, for example. Heat sinks are used, for example, in power electronics, or in control devices, in particular for the purpose of cooling power semiconductors (for example, power diodes, or power transistors).

Wired components have been and are very frequently used in the field of power electronics, for example. Here, a wired component has wire connections, i.e., "pins", which are plugged through contact holes in the carrier plate and are then connected to the carrier plate, for example, via soldering. For cooling, the components were connected or fitted to a heat sink, for example, where the components were coated with a thermally conductive paste, for example, a better thermal connection. The components then formed, for example, with the respective heat sink, their own cooled group of components that could be fitted or soldered to the carrier plate. A disadvantage of this procedure was, in particular, the fact that the wired component and the cooled group of components can or could usually be assembled in a predominantly manual manner or only in a semi-automated manner. That is, the process of assembling wired components and assembling associated heat sinks therefore cannot be thoroughly automated and is therefore not very efficient in terms of time and is associated with additional costs.

With the development of surface mounted device (SMD) variants for semiconductor components, power components, for example, can also be soldered to a carrier plate in an areal manner. So-called "thermal vias" or plated-through holes can be used to connect components that produce a power loss or heat to the carrier plate in a thermally effective manner, for example, and to improve heat transport perpendicular to the printed circuit board. Here, thermal vias are plated-through holes, i.e., a vertical, possibly also electrical, connection in the form of a hole that is metalized on the inside in the carrier plate or printed circuit board, where the primary task here is to improve heat dissipation. Relatively good heat dissipation is therefore possible, for example, via a side of the carrier plate that is not fitted with components at least in the region of components which produce a power loss and are to be cooled, i.e., in a cooling region. A heat sink for cooling a component can therefore also be arranged on this side of the carrier plate (for example, underside of the carrier plate).

In order to promote heat dissipation, heat sinks require a good thermal connection to the component to be respectively cooled. It is therefore necessary to establish contact that is as close and good as possible between the heat sink and the component to be cooled. In order to compensate for unevenness, for example, between the underside of the carrier plate and a surface of the heat sink, and in order to establish better heat transfer to the heat sink, a thin layer of thermally conductive paste, for example, can be applied before assembly. In the case of electrically insulating assembly, an electrically insulating layer and/or insulation can be used, for example, to compensate for unevenness and to improve heat transfer.

In order to establish the accordingly close and good thermal contact between the component to be cooled and the heat sink, the component is usually also pressed against the heat sink. For this purpose, it is possible to use, for example, spring plates that are arranged on the components to be cooled, for example, and are fastened via screws or clamps. The spring plates then cause, for example, a contact-pressure force that presses the components against the carrier plate and therefore against the heat sink arranged on the underside of the carrier plate. However, the use of spring plates to press on components has the disadvantage that assembly must usually be performed manually and is associated with a relatively large amount of effort.

Particularly in the case of electrical devices (for example, switched-mode power supplies, power electronic circuits), predefined voltage separations or minimum distances for air and creepage paths between conductive parts in the circuit must be additionally taken into account, for example, for safety and/or functional reasons. Therefore, particularly during cooling or in the case of a thermal connection between the component to be cooled and the heat sink via plated-through holes or thermal vias and when using, for example, spring plates to press on the components to be cooled, relatively large distances in the arrangement of the components to be cooled on the carrier plate and additional insulating films and/or insulating elements for increasing the voltage separations are required in order to comply with the necessary or predefined voltage separations. In addition to a higher space requirement for the circuit, this also results in relatively time-consuming and complex assembly of the electrical device, which must be carried out in a largely manual manner.

SUMMARY OF THE INVENTION

In view of the foregoing, it is therefore and object of the invention to provide a device and method for assembling an electrical device that is arranged on a carrier plate and that has at least one component to be cooled, where the method is intended to be able to be performed in an efficient manner with respect to time and costs and the device is intended to be able to be assembled quickly and easily, and where the method and the associated device at least make it possible to partially automate assembly.

This and other objects and advantages are achieved in accordance with the invention by a method for assembling an electrical device, in particular a switched-mode power supply or a power electronic circuit, where the electrical device is constructed from components and/or groups of components that form the circuit for the electrical device and that are fitted to a carrier plate or printed circuit board. At least one component of the electrical device produces a power loss in the form of heat that is dissipated via a thermal connection to a heat sink. When assembling the electrical device fitted to the carrier plate, at least the following steps are executed:
  a. providing at least the heat sink having at least one preassembled fastening body for fitting at least one contact-pressure element and insulation having at least one insulating sleeve, where the position of the at least one fastening body on the heat sink and the position of the at least one insulating sleeve on the insulation are predefined by a position of the at least one component to be cooled on the carrier plate;
  b. fitting the insulation to the heat sink such that the at least one fastening body is inserted into the at least one insulating sleeve of the insulation;
  c. fitting the carrier plate of the device having the at least one component to be cooled to the insulation such that the at least one fastening body inserted into the insulating sleeve is introduced into an outlet in the carrier plate, where the position of the outlet in the carrier plate is predefined by the position of the at least one component to be cooled on the carrier plate;
  d. fitting the contact-pressure element to the at least one fastening body of the heat sink; and
  e. connecting the contact-pressure element to the at least one fastening body such that the at least one component to be cooled is braced with the heat sink via the carrier plate and the insulation.

The main aspect of the method in accordance with the invention is that the method can be performed at least partially, in particular method steps b), c) and d), very easily in an automated manner. The configuration of the heat sink with a preassembled fastening body and of the insulation having an insulating sleeve for the fastening body makes it possible to easily align and join these units. Furthermore, the carrier plate having the circuit of the electrical device can likewise be fitted and positioned very easily in an automated manner because the at least one fastening body must be introduced into the corresponding outlet in the carrier plate. The electrical device can therefore be assembled in an efficient manner with respect to time and costs.

The assembly method in accordance with the invention also makes it possible for the components to be cooled to be optimally pressed onto the heat sink, in particular by virtue of the contact-pressure element which is used. At the same time, a closer and more space-saving component arrangement on the carrier plate is enabled in this case. This is possible, in particular, if the contact-pressure element for pressing on at least one component to be cooled has an embodiment, for example, which is described in the previously unpublished European patent application EP 18196828.0. In this case, the contact-pressure element is ideally formed as a plastic injection-molded part, in particular made from a high-performance plastic (for example, polyetherimide (PEI) or polyamide-imide (PAI)), as a result of which, on the one hand, no undesirable electrical and/or electromagnetic effects or an EMC effect occur(s) during operation of the electrical device and, on the other hand, a resilient effect or a contact-pressure force on the at least one component to be cooled is ensured over a wide temperature range by virtue of the contact-pressure element.

It is advantageous if, after the contact-pressure element has been connected to the at least one fastening body, the electrical device is also pushed into a housing, for example, in a final assembly step. The electrical device joined to the heat sink and the insulation can be arranged in the housing very easily, possibly in an automated manner. It is also conceivable for a housing front plate or cover and a fastening apparatus to be finally fitted to the housing rear wall, for example.

Before the carrier plate having the electrical device and the at least one component to be cooled is joined to the insulation, a thermally conductive paste is ideally used in order to improve thermal conductivity. A composition of the thermally conductive paste used is dependent, for example, on the thermal conductivity, an application and a continuous operating temperature range of the thermally conductive paste. Thermally conductive pastes usually mainly contain silicone oil and zinc oxide or possibly aluminum, copper, graphite and silver constituents. Furthermore, slight surface unevenness can also be compensated for by the thermally conductive paste. Here, the thermally conductive paste can be applied either to a side of the carrier plate facing the insulation or to a top side and/or underside of the insulation.

In one preferred embodiment of the method in accordance with the invention, after the insulation has been fitted to the heat sink or in a preparation phase, at least one insulating element is fitted into a corresponding outlet in the insulation. A position of the corresponding outlet in the insulation for fitting the at least one insulating element is predefined by the position of the at least one component to be cooled on the carrier plate. That is, the position at which the respective insulating element is fitted in the insulation is selected such that the respective insulating element is arranged in the region of a plated-through hole or in the cooling region of the respective component to be cooled.

The insulating element ensures additional and improved DC isolation between the conductive parts of the component or plated-through holes of the component and the metal heat sink. The insulating element is ideally configured such that a predefined voltage separation between the heat sink and the at least one component to be cooled is complied with.

For this purpose, the insulating element may be adapted, for example, to the shape of the component to be cooled or the corresponding plated-through hole in the carrier plate and may be rectangular or square, for example.

Side edges of the insulating element may be ideally stepped, where, when a cross section of the insulating element is considered, for example, a middle step projects beyond a step facing the carrier plate and a step facing the heat sink. As a result, the insulating element can be fitted very easily into the outlet in the insulation. Furthermore, this easily complies with the predefined voltage separation or the necessary minimum distance for the creepage path between the component to be cooled and the heat sink. Furthermore, the simple shape of the insulating element can also be readily used for automated handling.

In addition to the DC isolation, the insulating element can also be used to forward heat to the heat sink. In this regard, the insulating element is ideally formed as a ceramic pressed part and therefore has good thermal conductivity and favorable insulating properties. It is also favorable in this case if a thermally conductive paste is applied to the at least one insulating element before insertion into the corresponding outlet in the insulation on a top side and/or underside of the insulating element. In this case, a so-called phase change material, which is fused onto the insulating elements, such as before fitting the insulating elements in the corresponding outlets, can be used as a thermally conductive paste, for example.

It is also advisable for the insulation to be formed as a plastic injection-molded part, ideally in the form of a plate. The at least one insulating sleeve for the at least one fastening body on the heat sink can be integrated in this case. As a result of the embodiment as an injection-molded part, the insulation can be adapted very easily and simply to the corresponding electrical device (for example, size, or need for insulating sleeves). Polycarbonate that has good insulating properties for DC isolation between the carrier plate and the metal heat sink and has an appropriate dielectric strength and thermal conductivity can be used as the material, for example.

In another expedient embodiment the method in accordance with the invention, the heat sink is used as a construction platform for the electrical device. In the simplest case, for example, the heat sink can be formed as an aluminum plate, upon which the at least one fastening body or the fastening bodies is/are preassembled at the positions predefined by the components to be cooled. The fastening bodies are, for example, formed as ceramic elements for improved heat transfer.

It is also favorable if the at least one fastening body is formed as a fastening dome, in particular a screw dome. The contact-pressure element is then connected to the fastening body by means of a fastener, ideally a screw. By virtue of this connection, the component to be cooled is then pressed onto the heat sink via the carrier plate and the insulation or the associated insulating element.

It is also an object of the invention to provide an electrical device, in particular a switched-mode power supply or a power electronic circuit. In accordance with the invention, the electrical device comprises components and/or groups of components that form a circuit of the electrical device and that are fitted to a carrier plate or a printed circuit board. At least one of the components produces a power loss that is dissipated via a thermal connection to a heat sink. Here, the electrical device is assembled or produced in layers in accordance with the assembly method of the disclosed embodiments of the invention. Here, provision is made of a heat sink as a construction platform for the electrical device, which has at least one preassembled fastening body. A position of the at least one fastening body on the heat sink is predefined by a position of the at least one component to be cooled on the carrier plate. The electrical device also comprises insulation having at least one insulating sleeve, the position of which is likewise predefined by the position of the at least one component to be cooled on the carrier plate. The insulation is fitted to the heat sink such that the at least one fastening body is inserted into the at least one insulating sleeve of the insulation. The carrier plate having the at least one component to be cooled is fitted to the insulation such that the at least one fastening body inserted into the insulating sleeve is introduced into an outlet in the carrier plate. Here, a position of the outlet in the carrier plate is predefined by the position of the at least one component to be cooled. Provision is also made of at least one contact-pressure element that is fitted to the at least one fastening body of the heat sink and is connected to the at least one fastening body such that the at least one component to be cooled is braced with the heat sink via the carrier plate and the insulation.

The main aspect of the electrical device or switched-mode power supply or electronic circuit in accordance with the invention is that the structure of the device is such that assembly can be completed very easily in an automated manner and in layers. The configuration of the heat sink with the preassembled fastening body and of the insulation having an insulating sleeve for the fastening body makes it possible to easily align and join these device units. Furthermore, the carrier plate having the circuit of the electrical device can likewise be positioned and fitted very easily in an automated manner because the at least one fastening body must be introduced into the corresponding outlet in the carrier plate. The electrical device can therefore be assembled in an efficient manner with respect to time and costs. The components to be cooled can be optimally pressed onto the heat sink by virtue of the contact-pressure element that is used, where a close and space-saving arrangement of the electrical device or of the circuit on the carrier plate is enabled. This is possible, in particular, if the contact-pressure element for pressing on at least one component to be cooled has, for example, an embodiment that is described in the previously unpublished European patent application EP 18196828.0.

The electrical device also advantageously comprises at least one insulating element that is fitted into a corresponding outlet in the insulation. The position of the outlet in the insulation is likewise predefined by the position of the at least one component to be cooled. This means that the at least one insulating element is arranged, for example, in the region of a plated-through hole of the component to be cooled and can ensure improved DC isolation between the conductive parts of the component and the heat sink. The at least one insulating element is ideally configured in this case such that a predefined voltage separation between the heat sink and the at least one component to be cooled is complied with. For this purpose, the insulating element that is formed as a ceramic pressed part, for example, can be adapted to the shape of the component, for example.

It is also favorable if the at least one insulating element has stepped side edges that can be used to fit the at least one insulating element into the accordingly configured outlet in the insulation in a dimensionally flush manner. On the one hand, this achieves the predefined voltage separation or the necessary minimum distance for the creepage path between the component and the heat sink. On the other hand, the insulating element can be handled very easily in an automated manner on account of the shape and can be fitted into the outlet in the insulation.

In a preferred embodiment of the electrical device, a housing (for example, metal housing) is included, into which the electrical device can be pushed, ideally in an automated manner. The heat sink rests in this case against a side of the housing in order to ensure improved heat dissipation to the outside, for example.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained below in an exemplary manner on the basis of the accompanying figures, in which.

DETAILED DESCRIPTION OF THE EXEMPLARY EMBODIMENTS

Figure 1:
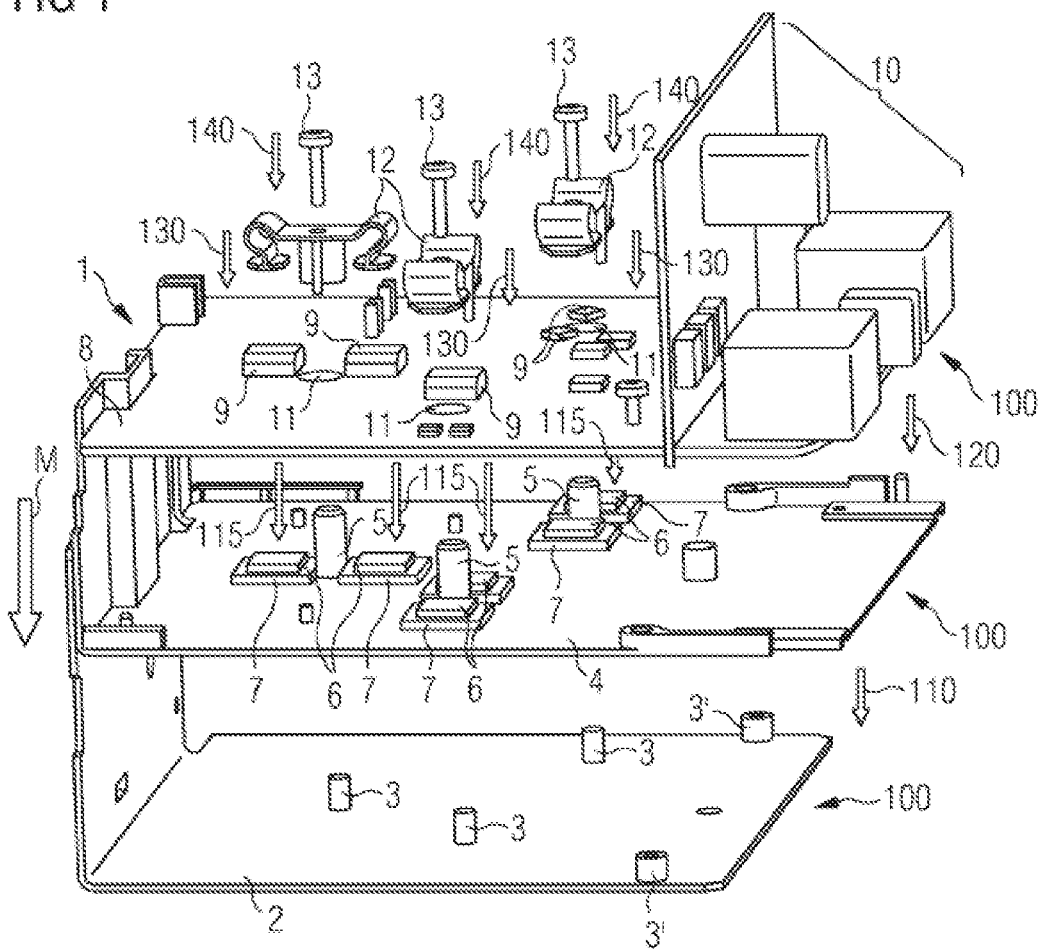
FIG. 1 shows an exemplary sequence of the method in accordance with the invention for assembling an electrical device based on units to be assembled.

FIG. 1 schematically shows, by way of example, an electrical device 1 which is constructed from components and groups of components 9, 10. The components and groups of components 9, 10 are fitted to a carrier plate 8. Here, at least one component 9, during operation of the electrical device 1, produces a power loss in the form of heat that must be dissipated via a thermal connection to a heat sink 2.

For the method in accordance with the invention for assembling the electrical device 1, in addition to the electrical device 1, the circuit of which comprising components and/or groups of components 9, 10 is arranged on the carrier plate 8, at least one heat sink 2 and insulation 4 are provided in a provision step 100.

Figure 2:
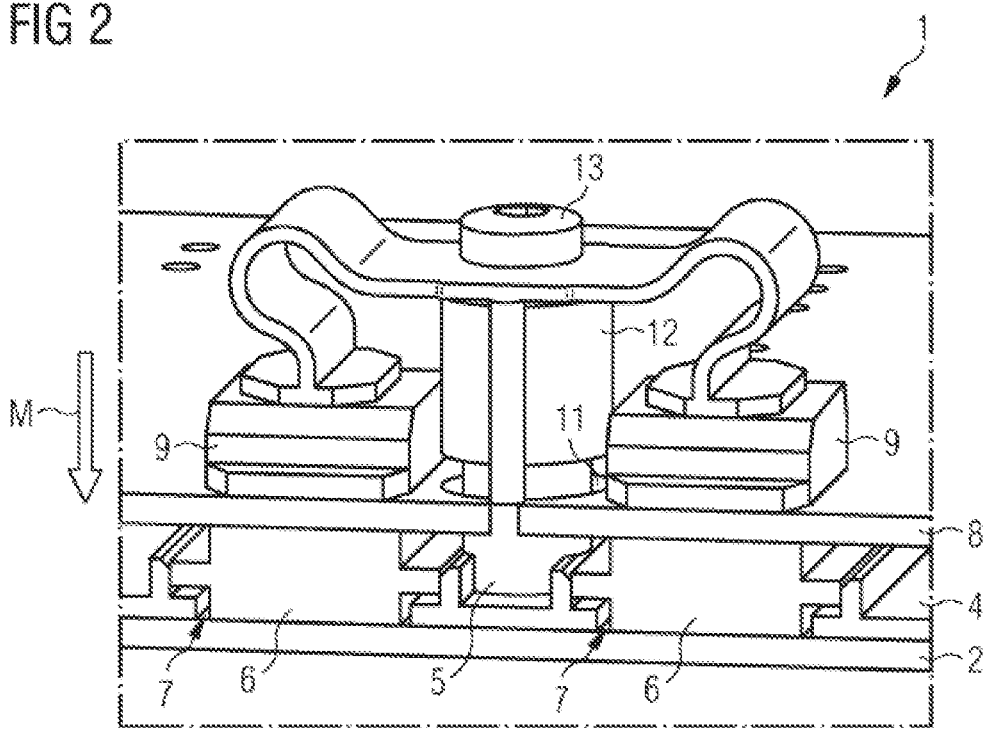
FIG. 2 schematically shows an exemplary section of the electrical device in a region of a component to be cooled in an assembled state after running through the method in accordance with the invention.

The heat sink 2 may be used, for example, as a construction platform for the fully assembled electrical device 1, as illustrated, by way of example, in FIG. 2. For this purpose, the heat sink 2 is, for example, formed as a plate made from a metal with good thermal dissipation, for example, from aluminum. The heat sink 2 also has at least one fastening body (for example, made from ceramic for good heat conduction) that is preassembled on the heat sink and is used to fasten a contact-pressure element 12. The position of the at least one preassembled fastening body is predefined by a position of the at least one heat-producing component 9 of the electrical device 1 on the carrier plate 8. The heat sink 2 may additionally have further fastening bodies 3' that can be used, for example, to additionally connect and/or fix the carrier plate 8 to/on the heat sink 2 in a region of larger components or groups of components 10, for example.

The insulation 4 is, for example, a plastic injection-molded part and may be formed as a plate. Polycarbonate that enables good heat conduction, on the one hand, and has good insulating properties, on the other hand, can be used as the material, for example. The insulation 4 also has at least one insulating sleeve 5 that can be integrated in the insulation 4. The position of the at least one insulating sleeve 5 is likewise predefined by the position of the at least one heat-producing component 9 or component to be cooled. Alternatively, the insulation 4 may also be or may be formed as an insulating film made of silicone, for example.

In a first joining step 110, the insulation 4 is then fitted to the heat sink 2 used as a construction platform, for example. Here, the at least one fastening body 3 of the heat sink 2 is inserted into the at least one insulating sleeve 5 of the insulation 4. That is, the positioning of the insulation 4 on the heat sink 2 is predefined by the at least one fastening body 3 and the insulating sleeve 5. The first joining step 110 can therefore be performed very easily in an automated manner. The insulation 4 may be additionally provided with a thermally conductive paste on a side facing the heat sink or an underside in an assembly direction M before the first joining step 110, for example. Alternatively, before fitting the insulation 4 in the first joining step 110, an insulating film made of silicone, for example, may be fitted between the heat sink 2 and the insulation 4 in order to displace air inclusions and to prevent hotspots from arising.

It is then possible to fit at least one insulating element 6 into an outlet 7 in the insulation in an intermediate step 115 after fitting the insulation 4 to the heat sink 2. Here, the position of the outlet 7 is predefined by the position of the at least one component 9 to be cooled on the carrier plate 8 of the electrical device 1 such that, in the assembled state (see FIG. 2), the at least one insulating element 6 comes to rest in the region of a contact-connection of the respective component 9 to be cooled.

For this purpose, the insulating element 6 is configured such that at least a predefined voltage separation (in particular a minimum creepage path to be complied with) between the component 9 to be cooled and the conductor tracks or a contact-connection of the component 9 and the heat sink 2 is complied with. In particular, the shape of the insulating element can be adapted to the contact-connection of the component 9 and has, for example, a square or rectangular shape. For a good thermally conductive and insulating effect, the insulating element 6 is formed as a ceramic pressed part, for example. In addition, before being fitted into the corresponding outlet 7, the insulating element 7 may be provided with thermally conductive paste or a "phase change material" for improved heat transfer on a top side and/or underside. For easier, in particular, automated fitting of the insulating element 6, may have stepped side edges, as is particularly clear in FIG. 2.

Alternatively, the at least one insulating element 6 may also be fitted into the corresponding outlet 7 in the insulation 4 in a preparation step before the insulation 4 is fitted in the first joining step 110. The insulation 4 is then fitted, together with the fitted insulating elements 6, to the heat sink 2 in the first joining step 110.

In a second joining step 120, the carrier plate 8 having the circuit of the electrical device 1 or having the at least one component 9 to be cooled is then fitted to the heat sink 2 provided with the insulation 4. Here, the carrier plate 8 is positioned on the insulation 4 such that the inserted fastening body 3 is introduced into an outlet 11 in the carrier plate 8. Here, the outlet 11 in the carrier plate 8 has a position such that the insulated fastening body 3 is introduced beside the at least one component to be cooled while complying with a predefined voltage separation, in particular a predefined air path. As illustrated in FIG. 1, the outlet 11 in the carrier plate is fitted, for example, between two components 9 to be cooled. After the second joining step 120, the respective insulated fastening body 3 preassembled on the heat sink is, for example, in the outlet 11 between the components 9 to be cooled.

Here, it should be noted that a distance between the carrier plate 8 and the insulation 4 is dependent, on the one hand, on creepage paths to be complied with between conductive parts, for example, plated-through holes or contact-connections of the components 9, 10, a heat sink 2, or a fastener 13, and possibly, on the other hand, on a space requirement of components 10 arranged on a side of the carrier plate 8 facing the insulation 4. That is, this distance between the carrier plate 8 and the insulation 4 can be established via insulating elements 6 or an appropriate configuration of the insulation 4.

Before the second joining step 120, that side of the carrier plate 8 which faces the insulation 4 can be additionally provided with thermally conductive paste. Alternatively or additionally, that side of the insulation 4 facing the carrier plate 8 (for example, a top side of the insulation 4 in the assembly direction M) can also be provided with thermally conductive paste for improved heat transfer.

In a third joining step 130, the contact-pressure element 12 is then fitted to the at least one fastening body 3 that is inserted into the insulating sleeve 5. Here, the contact-pressure element is at least configured such that the insulated fastening body 3 can be inserted into the contact-pressure element 12 and the contact-pressure element 12 has at least one device for pressing on the at least one component 9 to be cooled. Here, it is favorable if the contact-pressure element 12 is configured in the manner described in the previously unpublished European patent application EP 18196828.0 and illustrated in FIG. 1 and is formed as a plastic injection-molded part. The configuration as a plastic injection-molded part (ideally made from a high-performance plastic, such as polyetherimide (PEI), OR polyamide-imide (PAI)) means that the contact-pressure element 12 does not cause any undesirable electrical and/or electromagnetic effects or an EMC effect and has a resilient effect over a wide temperature range (i.e., the respective component 9 to be cooled is pressed against the heat sink 2 with the corresponding contact-pressure force over a wide temperature range by the contact-pressure element 12).

In a fastening step 140, the contact-pressure element 12 is then connected to the at least one fastening body 3 inserted into the corresponding insulating sleeve 5 and the at least one component 9 to be cooled is thereby pressed onto the heat sink via the carrier plate 8 and the insulation 4 or the corresponding insulating element 6. For this purpose, the fastening body 3 may be, for example, formed as a fastening dome, in particular a screw dome with an internal thread. In the fastening step 140, a fastener 13, in particular a screw, is then introduced, for example, into an outlet in the contact-pressure element 12 and is connected to the fastening body 3. As a result of the contact-pressure element 12 being fixed to the fastening body 3, the contact-pressure element 12 then exerts a pressure on the at least one component 9 to be cooled and presses the latter against the carrier plate 8 and therefore also against the heat sink 2. As an alternative to a screw, a rivet can also be used as fastener 13. Furthermore, mechanical connections, for example, a snap-type connection or a press fit, are also conceivable for fastening the contact-pressure element 12 to the fastening body 3 and for pressing on the component 9.

After running through the assembly steps of the method in accordance with the invention, in particular the joining steps 110, 120, 130 and the fastening step 140, the electrical device 1 can be pushed into a housing in an additional, final assembly step 150, for example, in an automated production line. The housing can then be closed, for example, with a front plate in which outlets for display and/or operating elements are available, for example. For example, a fastening and latching apparatus may also be installed on a housing rear wall, for example, in order to fit the electrical device 1 in an equipment cabinet and/or to a top-hat rail for operation, for example.

FIG. 2 schematically shows an exemplary section of the electrical device 1 in the region of components 8 to be cooled after the units illustrated in FIG. 1, e.g., heat sink 2, insulation 4, carrier plate 8 having the components 9, 10, or contact-pressure elements 12, have been joined with the aid of the method in accordance with the invention.

The components 9 to be cooled are fitted, in addition to further components and groups of components 10 that are not illustrated in FIG. 2, to the carrier plate 8. In the assembled state, the heat sink 2 that is provided in the provision step 100 and forms the construction platform for the electrical device 1 is arranged on a side of the carrier plate 8 which has not been equipped with components at least in the region of the components 9 to be cooled or in the cooling region or on an underside of the carrier plate 8 in the assembly direction M. The at least one preassembled fastening body 3 on the heat sink (not visible in FIG. 2) has been inserted in this case into the insulating sleeve 5 of the insulation 4 on account of the first joining step 110. The outlet 11 is provided in the carrier plate 8, for example between components 9 to be cooled, into which outlet the fastening body 3 inserted into the insulating sleeve 5 was introduced in the second joining step 120.

The insulation 4 fitted in the first joining step 110 is arranged between the heat sink 2 and the carrier plate 8. For additional DC isolation of the carrier plate 8 or the contacts, in particular plated-through holes, of the components 9 from the heat sink 2 that may be formed from metal, in particular aluminum, insulating elements 6 may be arranged in the contact-connection region of the components 9 to be cooled. These insulating elements 6 may be fitted into the corresponding outlets 7 in the insulation 4 in a dimensionally flush manner in the additional, intermediate step 115 before the second joining step 120 or in a preparation step, for example.

After the second joining step 120 in which the carrier plate 8 having the circuit of the electrical device 1 has been fitted, the contact-pressure elements 12 are fitted to the fastening bodies 3 in the third joining step 130. Here, the contact-pressure element 12, for example, is introduced into the outlet 11 in the carrier plate 8 in the assembly direction M, from which the insulated fastening body 3 or at least the associated insulating sleeve 5 projects counter to the assembly direction M. Here, devices for pressing on the components 9 (for example, spring arms or associated bearing surfaces) of the contact-pressure element 12 come to rest on the components 9 to be cooled, for example, and a central part of the contact-pressure element 12 accommodates the fastening body 3 that has been inserted into the insulating sleeve 5.

In the fastening step 140, a fastener 13, in particular a screw or a rivet, is then inserted, for example, into an outlet on the upper side of the contact-pressure element 12 in the assembly direction M. The fastener 13 is then connected to the fastening body 3 in the assembled state such that the contact-pressure element 12 transmits a contact-pressure force to the components 9 to be cooled, for example via its bearing surfaces. That is, the components 9 are pressed against the carrier plate 8 and therefore against the heat sink 2 after the contact-pressure element 12 has been fixed.

After running through the assembly steps of the method in accordance with the invention, in particular the joining steps 110, 120, 130 and the fastening step 140, the fully assembled electrical device 1 can be pushed into a housing in the final assembly step 150, for example, in an automated production line. The housing can then be closed, for example, and can be provided with a fastening apparatus. The electrical device 1 fitted in the housing can then be installed, for example, in a switchgear cabinet and/or on a rail.

Figure 3:
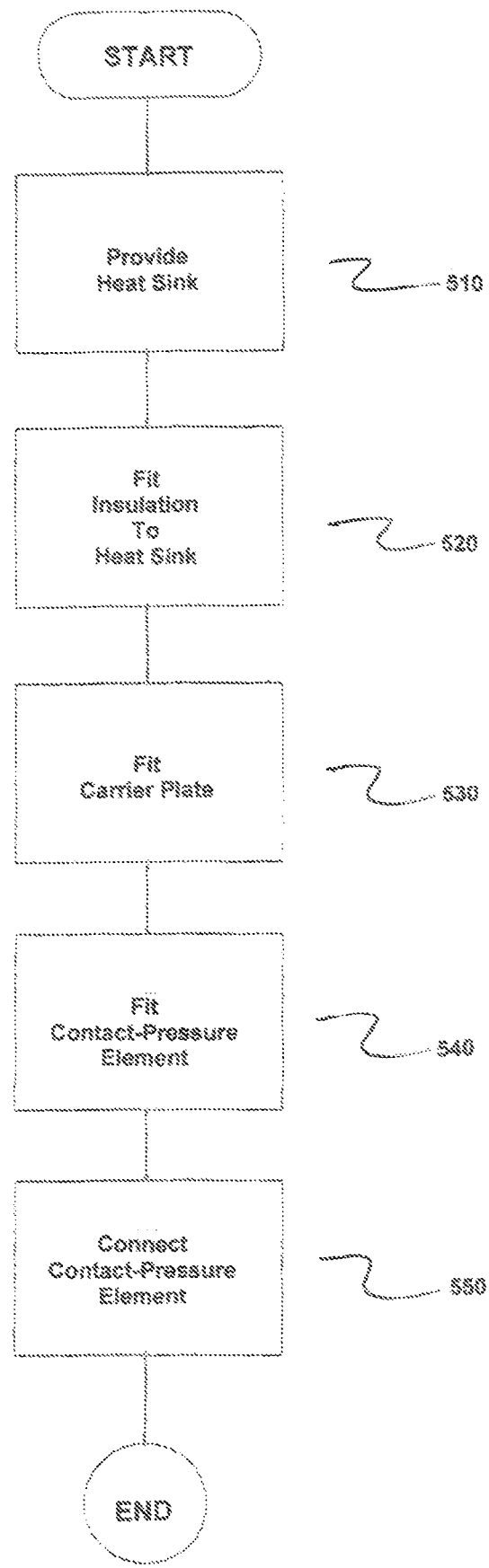
FIG. 3 is a flowchart of the method in accordance with the invention.

FIG. 3 is a flowchart of the method for assembling an electrical device 1 that is constructed from at either components and/or groups of components 9, 10 fitted to a carrier plate 8, where at least one component 9 produces a power loss that is dissipated via a thermal connection to a heat sink 2. The method comprises providing at least the heat sink 2 having at least one preassembled fastening body 3 for fitting at least one contact-pressure element 12 and insulation 4 having at least one insulating sleeve 5, as indicated in step 300. In accordance with the invention, the position of the at least one preassembled fastening body 3 on the heat sink 2 and the position of the at least one insulating sleeve 5 on the insulation 4 are predefined by the position of the at least one component 9 to be cooled on the carrier plate 8.

Next, the insulation 4 is fitted to the heat sink 2 such that the at least one preassembled fastening body 3 is inserted into the at least one insulating sleeve 5 of the insulation 4, as indicated in step 310.

Next, the carrier plate 8 of the device 1 having the at least one component 9 to be cooled is fitted to the insulation 4 such that the at least one preassembled fastening body 3 inserted into the insulating sleeve 5 is introduced into an outlet 11 in the carrier plate 8, as indicated in step 320. In accordance with the invention, the position of the outlet 11 in the carrier plate 8 is predefined by the position of the at least one component 9 to be cooled on the carrier plate 8.

Next, the contact-pressure element 12 is fitted to the at least one preassembled fastening body 3 of the heat sink 2, as indicated in step 330.

Next, the contact-pressure element 12 is connected to the at least one preassembled fastening body 3 such that the at least one component 9 to be cooled is braced with the heat sink 2 via the carrier plate 8 and the insulation 4, as indicated in step 340.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for assembling an electrical device which is constructed from at least one of (i) components and (ii) groups of components fitted to a carrier plate, at least one component producing a power loss which is dissipated via a thermal connection to a heat sink, the method comprising:
   a. providing at least the heat sink having at least one preassembled fastening body for fitting at least one contact-pressure element and insulation having at least one insulating sleeve, a position of the at least one preassembled fastening body on the heat sink and a position of the at least one insulating sleeve on the insulation being predefined by a position of the at least one component to be cooled on the carrier plate;
   b. fitting the insulation to the heat sink such that the at least one preassembled fastening body is inserted into the at least one insulating sleeve of the insulation;
   c. fitting the carrier plate of the device having the at least one component to be cooled to the insulation such that the at least one preassembled fastening body inserted into the insulating sleeve is introduced into an outlet in the carrier plate, a position of the outlet in the carrier plate being predefined by the position of the at least one component to be cooled on the carrier plate;
   d. fitting the contact-pressure element to the at least one preassembled fastening body of the heat sink; and
   e. connecting the contact-pressure element to the at least one preassembled fastening body such that the at least one component to be cooled is braced with the heat sink via the carrier plate and the insulation.

2. The method as claimed in claim 1, wherein, after the contact-pressure element is connected to the at least one fastening body, the electrical device is additionally pushed into a housing.

3. The method as claimed in claim 1, wherein, before fitting the carrier plate to the insulation, a thermally conductive paste is applied to at least one of (i) a side of the carrier plate facing the insulation or to a top side and (ii) and underside of the insulation.

4. The method as claimed in claim 1, wherein, after the insulation has been fitted to the heat sink or in a preparation phase, at least one insulating element is fitted into a corresponding outlet in the insulation; and wherein a position of the at least one outlet in the insulation is predefined by the position of the at least one component to be cooled.

5. The method as claimed in claim 4, wherein the at least one insulating element is configured such that a predefined voltage separation between the heat sink and the at least one component to be cooled is complied with.

6. The method as claimed in claim 5, further comprising:
   providing stepped side edges in the at least one insulating element such that the at least one insulating element is fittable into an accordingly configured outlet in the insulation in a dimensionally flush manner.

7. The method as claimed in claim 4, further comprising:
   providing stepped side edges in the at least one insulating element such that the at least one insulating element is fittable into an accordingly configured outlet in the insulation in a dimensionally flush manner.

8. The method as claimed in claim 4, wherein the at least one insulating element is formed as a ceramic pressed part.

9. The method as claimed in claim 4, wherein a thermally conductive paste is applied to the at least one insulating element before insertion into the corresponding outlet in the insulation on at least one of (i) a top side and (ii) underside of the insulating element.

10. The method as claimed in claim 1, wherein the insulation is configured in a plate-shaped manner as a plastic injection-molded part having at least one integrated insulating sleeve for the at least one fastening body.

11. The method as claimed in claim 1, wherein the heat sink forms a construction platform for the electrical device.

12. The method as claimed in claim 1, wherein the at least one fastening body comprises a fastening dome; and wherein the contact-pressure element is connected to the at least one preassembled fastening body via a fastener.

13. The method as claimed in claim 12, wherein the fastening dome comprises a screw dome; and wherein the fastener comprises a screw.

14. An electrical device having a carrier plate with at least one of (i) components and (ii) groups of components fitted thereto, at least one component producing a power loss which is dissipated via a thermal connection, the electrical device comprising:
   a heat sink which forms a construction platform for the electrical device having at least one preassembled fastening body, a position of the at least one preassembled fastening body on the heat sink being predefined by a position of the at least one component to be cooled on the carrier plate;
   insulation having at least one insulating sleeve, a position of said insulation being predefined by a position of the at least one component to be cooled on the carrier plate, the insulation being fitted to the heat sink such that the at least one preassembled fastening body is inserted into the at least one insulating sleeve of the insulation, and the carrier plate having the at least one component to be cooled being fitted to the insulation such that the at least one preassembled fastening body inserted into the insulating sleeve is introduced into an outlet in the carrier plate, and a position of at least one preassembled fastening body in the carrier plate being predefined by a position of the at least one component to be cooled; and
   at least one contact-pressure element fitted to the at least one preassembled fastening body of the heat sink and connected to the at least one fastening body such that the at least one component to be cooled is braced with the heat sink via the carrier plate and the insulation.

15. The electrical device as claimed in claim 14, further comprising:
   at least one insulating element fitted into a corresponding outlet in the insulation;
   wherein a position of the corresponding outlet in the insulation is predefined by the position of the at least one component to be cooled; and
   wherein the at least one insulating element is configured such that a predefined voltage separation between the heat sink and the at least one component to be cooled is complied with.

16. The electrical device as claimed in claim 15, wherein the at least one insulating element includes stepped side edges which are utilized to fit the at least one insulating element into an accordingly configured outlet in the insulation in a dimensionally flush manner.

17. The electrical device as claimed in claim 16, further comprising:
   a housing into which the electrical device is pushed;
   wherein the heat sink rests against a side of the housing.

18. The electrical device as claimed in claim 15, further comprising:
   a housing into which the electrical device is pushed;
   wherein the heat sink rests against a side of the housing.

19. The electrical device as claimed in claim 14, further comprising:
   a housing into which the electrical device is pushed;
   wherein the heat sink rests against a side of the housing.

20. The electrical device as claimed in claim 14, wherein the electrical device comprises a switched-mode power supply.

* * * * *